United States Patent
Lee et al.

(10) Patent No.: US 6,235,642 B1
(45) Date of Patent: May 22, 2001

(54) METHOD FOR REDUCING PLASMA CHARGING DAMAGES

(75) Inventors: Tzung-Han Lee, Taipei; Mu-Chun Wang, Hsin-Chu, both of (TW)

(73) Assignee: United Microelectronics Corporation, Hsin-Chu (TW)

( * ) Notice: Subject to any disclaimer, the term of this patent is extended or adjusted under 35 U.S.C. 154(b) by 0 days.

(21) Appl. No.: 09/483,580

(22) Filed: Jan. 14, 2000

(51) Int. Cl.⁷ .................................................. H01L 21/00
(52) U.S. Cl. ........................ 438/710; 438/259; 438/694; 438/700; 438/669
(58) Field of Search ................................ 438/666, 642, 438/599, 910, 259, 694, 710

(56) References Cited

U.S. PATENT DOCUMENTS

| | | | |
|---|---|---|---|
| 5,429,964 | * 7/1995 | Yilmaz et al. | 437/41 |
| 5,910,452 | * 6/1999 | Kang et al. | 438/710 |
| 5,998,299 | * 12/1999 | Krishnan | 438/694 |
| 6,013,927 | * 1/2000 | Bothra et al. | 257/328 |
| 6,107,140 | * 8/2000 | Lee et al. | 438/259 |

* cited by examiner

Primary Examiner—Matthew Smith
Assistant Examiner—V. Yevsikov

(57) ABSTRACT

A method for reducing plasma charging damages is disclosed. The method includes the following steps: define cell regions and scribe line regions on a substrate. Then, form a trench region on one of the scribe line regions wherein the bottom part of the trench region is in contact with the substrate. Thereupon fill the trench region with polysilicon substances. After the filling, deposit a pad polysilicon layer on the trench region. Following the pad layer formation, construct an integrated circuit as routine practice. During the circuit fabrication, several channel regions are formed in connection with the pad layer. Next, fabricate various conductive structures on the scribe line regions and link them also to the channel regions. Any excess charge in the scribe line region would be collected by the conductive structures and directed by the channel region to the trench region for grounding. Upon completion of the device fabrication, insulate the process to prevent charges from shifting back to the scribe line regions and damaging the device.

22 Claims, 3 Drawing Sheets

METHOD FOR REDUCING PLASMA CHARGING DAMAGES

BACKGROUND OF THE INVENTION

1. Field of the Invention

The present invention relates to a trench structure forming on scribe line regions of a wafer substrate for grounding purpose. The trench structure connects all conductive structures in the scribe line regions for complete channeling and collect excess charge created during IC fabrication to discharge; it is used to reduce device damage due to plasma charging phenomena.

2. Description of the Prior Art

With the development of IC fabrication techniques, critical dimensions of integrated circuits have moved down to about 0.25 µm and diameters of fabricated wafers have ranged up to about 8 inches. Selectivity and uniformity of etching process are undoubtedly crucial factors of device performance. As a result, conventional reactive ion etch (RIE)' owning to its high operating pressure, has gradually being replaced by some advanced methods, such as high density plasma (HDP) etch. HDP is the best suited submicron techniques currently being developed. It has the mechanism not only to provide plasma under fairly low pressure to keep ion-bombarding damage minimal, but also to control plasma density and ion energy separately to maintain good etching uniformity of the large-sized wafer. However, one of the drawbacks of HDP is that excess ions are inevitably produced during the etching process under such high density of plasma. These ions eventually attack the device surface and thus affect the process uniformity.

According to the principle of semiconductor devices, one should realize that the quality of gate oxide is a key factor of device performance. Once charging phenomena appeared near the interface of Si—SiO$_2$, opposite charges are incidentally induced and gathered along the silicon (substrate) side. The characteristics of the gate are thus changed due to the different electrical environment. The affected characteristics include threshold voltage, breakdown voltage and reliability of the product.

Typical charges found in the oxide layers are as follows: (1) interface trapped charge; (2) fixed oxide charge; (3) mobile ion charge; and (4) oxide trapped charge. Among these charges, the oxide trapped charges, which include the electrons and holes produced primarily by process such as ion implantation and plasma etch, are randomly distributed on the oxide layers.

The divergence of local charge distributions results in the accumulation of most charges on conductors (such as polysilicon and aluminum alloys) with relatively large cross section area or with considerably long line length. As the plasma etching continues, the electrical charge keeps on building up until the capacitance limitation has been reached. This limitation is easily been reached for thin layers such as gate oxide. Once the capacitance no longer holds for the oxide, the current would be discharged throughout the layer and end up with charging damages (so call "antenna effect") of the oxide.

Plasma charging damages are the damages induced by plasma. It is essentially resulted from the antenna effect. An antenna ratio is defined as the ratio of the cross sectional areas or line lengths between a conductor and the gate oxide layer. A conductor with a large antenna ratio represents a huge amount of charge accumulation possible within the conductor and relatively high capacitance conceivable on the gate oxide layer. Therefore the larger the antenna ratio is, the more severe the damages would be. In addition, the longer the etching process is, the more severe the damages would also get. The longer the current passes through, the more defects would be created. In general, antenna effects are grouped by process approaches into area effects and length effects. One example for the area effects is photoresist ashing. During the stripping of photoresist layers, conductors have to be exposed under oxygen (mostly used) plasma and the charges are collected area-wise. The larger the conductor area is, the more charges the conductor would pick up. On the other hand, the length effects can be found in etching of polysilicon and aluminum layers. During the etching process, the surfaces of these conductors are protected by other layers (such as the resist layer). One way to take in the charges is from the lateral of the layers. The longer the layers are, the more charges the conductors would receive and the more damaging the device would be.

To enhance the device quality, the present invention proposes a method that can efficiently reduce the damages of plasma charging.

SUMMARY OF THE INVENTION

In accordance with the present invention, a method is provided for forming a trench region on scribe line regions that substantially reduce device damages due to plasma charging. In one embodiment, the trench region is constructed for completely channeling of all conductive structures in the scribe line region so that excess charges would be directed to the trench region for grounding. The plasma charging damages are thus largely reduced.

Another objective of the present invention is to improve the characteristics of gate oxide layers, more particularly, to enhance the device quality and to keep up with the market competition.

The method proposed here includes the following steps: define cell regions and scribe line regions on a substrate. Then, form a trench region on one of the scribe line regions wherein the bottom part of the trench region is in contact with the substrate. Thereupon fill the trench region with polysilicon substances. After the filling, deposit a pad polysilicon layer on the trench region. Following the pad layer formation, construct an integrated circuit as routine practice. During the circuit fabrication, several channel regions are formed in connection with the pad layer. Next, fabricate various conductive structures on the scribe line regions and link them also to the channel regions. Any excess charge in the scribe line region would be collected by the conductive structures and directed by the channel region to the trench region for grounding. Upon completion of the device fabrication, insulate the process to prevent charges from shifting back to the scribe line regions and damaging the device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
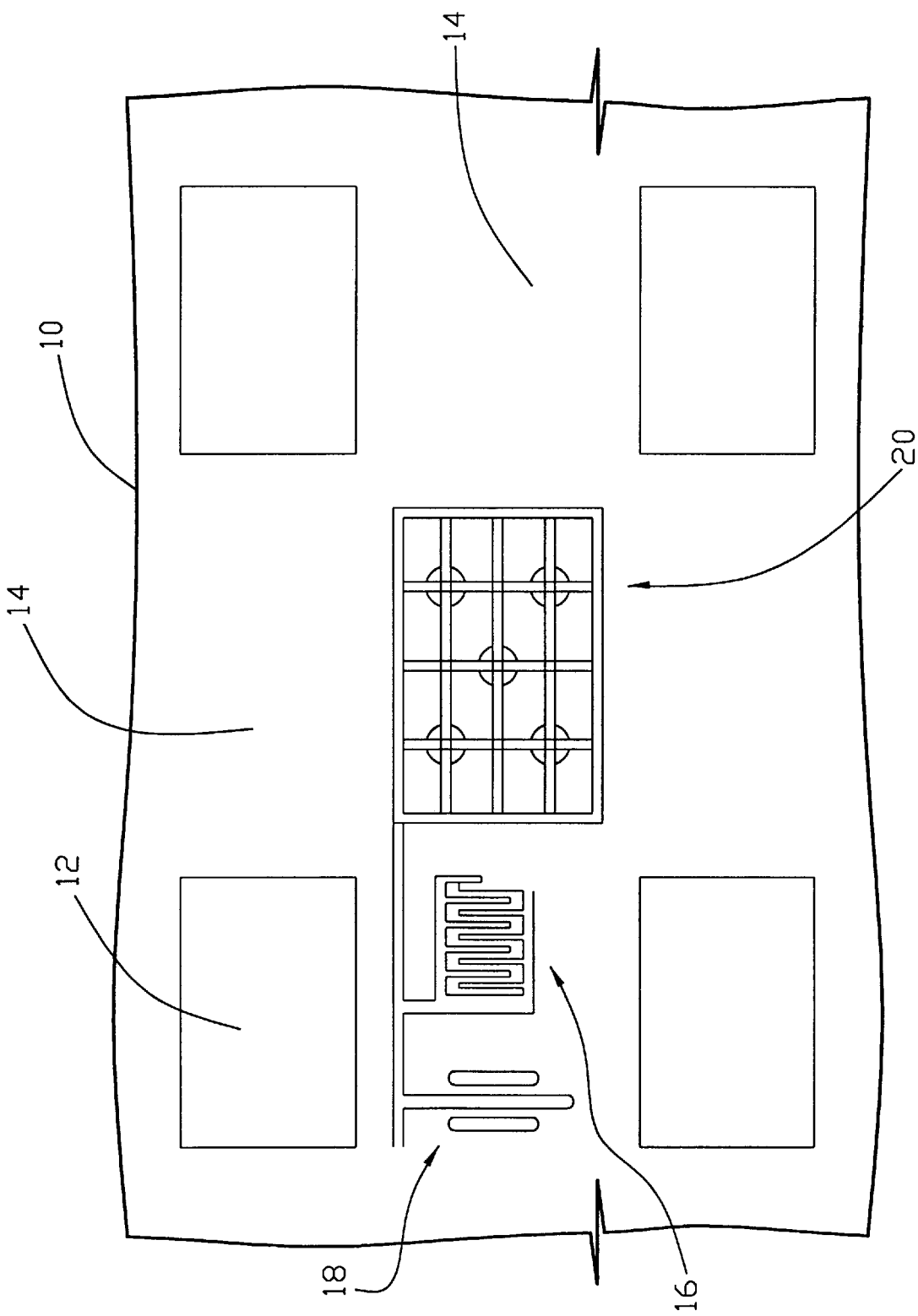
FIG. 1 is a top view showing a charge-releasing channeling structure on a silicon substrate.
Figure 2:
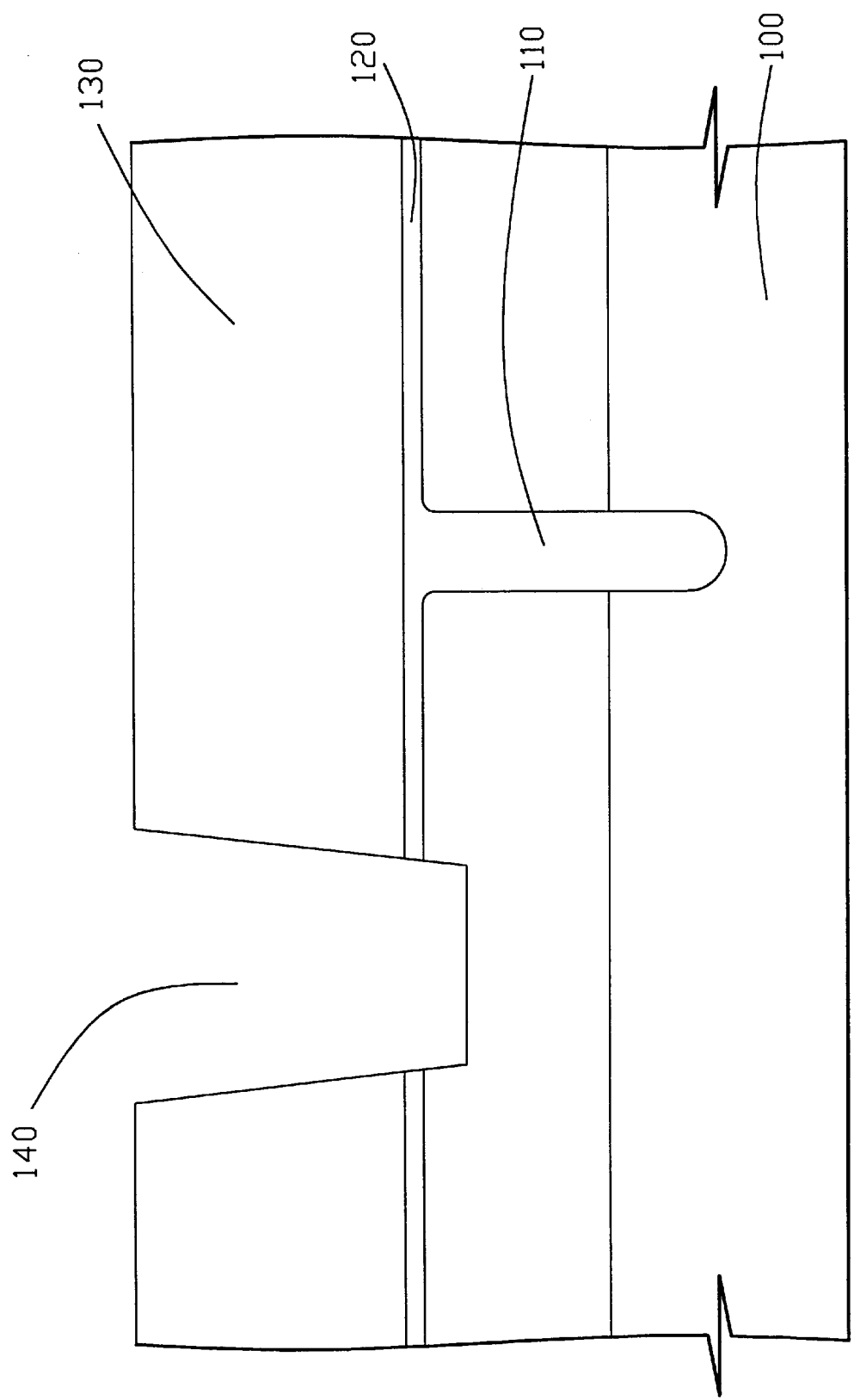
FIG. 2 is the cross-sectional view showing the channeling structure and a trench region.
Figure 3:
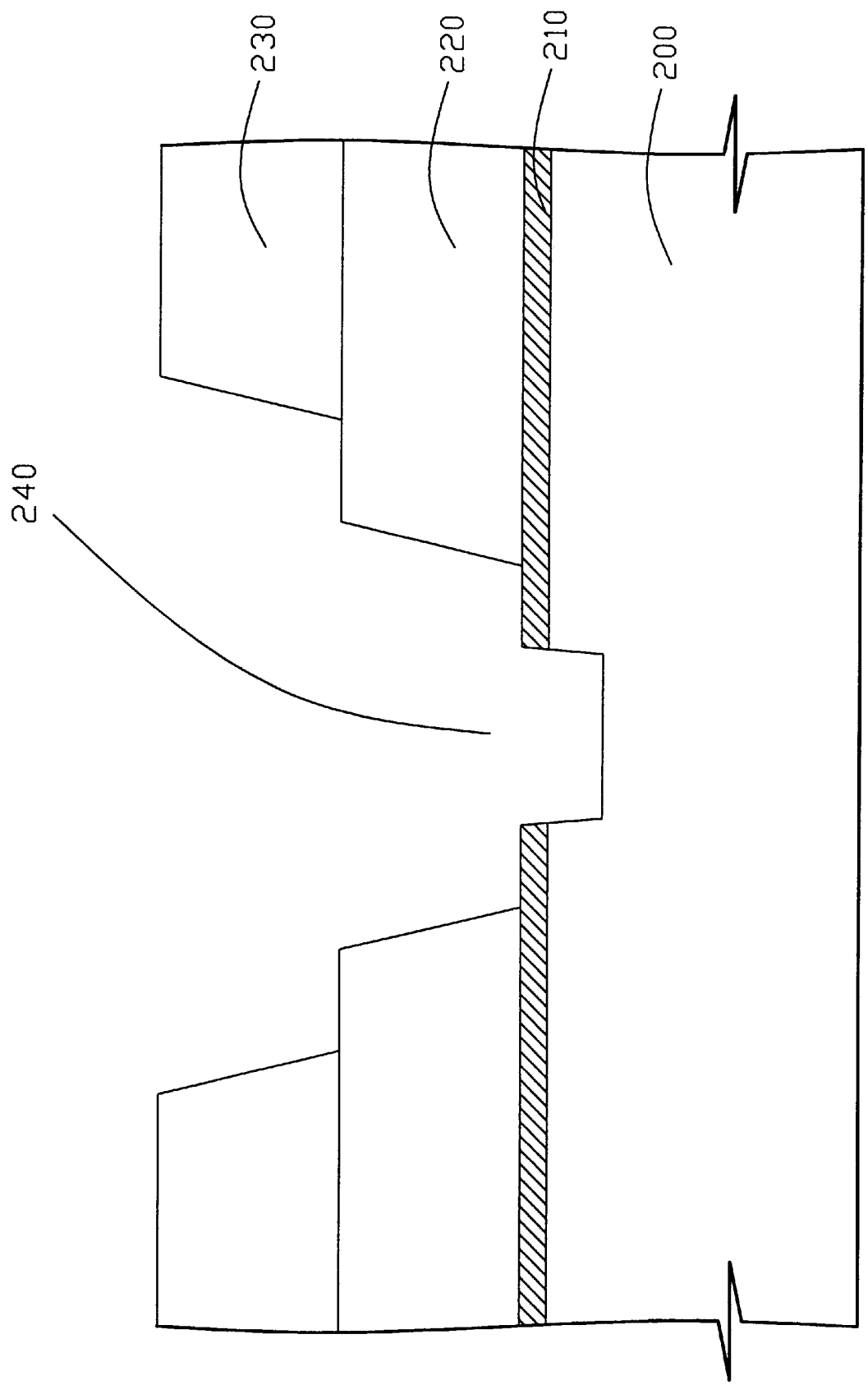
FIG. 3 is a cross-sectional view showing an opening formed by pad etching for the purpose of disconnecting the channeling structure and the trench region.

FIGS. 1 to 3 schematically illustrate a method for forming channeling structure on scribe line regions of a substrate to reduce plasma charging damages in accordance with one embodiment of the present invention.

In general, excess charges produced by an IC fabrication process are distributed in scribe line regions, not in cell regions. Thus the following descriptions are directed only on the scribe line regions. Referring now to FIG. 1, a silicon substrate 10 is provided. A plurality of cell regions 12 and a plurality of scribe line regions 14 are then defined on the substrate. Once these regions are determined, construct necessary device structures upon the cell regions and form several channeling structures through the scribe line regions. The channeling structures include various conductive structures and several channel regions 20. The conductive structures may contain appliances such as test key 16, alignment key and CD bar 18, etc. It is noted that these conductive structures are made on metal layers or poly layers having ample deposition areas so that there would be enough space for configuring these structures to resemble antennas and thus increase areas for charge collecting. In addition, the conductive structures are connected with the channel regions for directing charge dispersion. The excess charges are now collected inside the channeling structures. The dispersion of the charges would be discussed next by referring the following two figures.

FIG. 2 is a detail illustration of the channeling structure. The figure shows a trench region 110 forming on a silicon substrate 100. The bottom part of the trench region 1 10 is in contact with the substrate. Then polysilicon substances are used to fill the trench region for grounding purpose. After the filling, deposit a layer of polysilicon pad 120 upon the trench region. This pad layer 120 serves to bridge the trench region with several channel regions. Channel regions 130 as shown in FIG. 2 link various conductive structures such as test key 16, alignment key and CD bar 18 on the scribe line regions. These conductive structures are made on metal layers or poly layers having deposition areas large enough for configuring these structures to resemble antennas and thus to increase areas for charge collecting. Upon the completion of the device channeling, the trench region 110 should now be able to collect all charges captured by the conductive structures in the scribe line regions. However, in order to prevent the collected charges from shifting back to the scribe line regions, an additional pad etching is therefore applied next. The pad etch results in an opening 140 which disconnects the channeling structures and the trench region so as to trap the charges on the trench side of the device. The trench region has been designed also for grounding so that the charges gathered here would then be directed away. The device damages due to process charging are thus largely reduced.

The detailed structure of the pad etched opening is further shown in FIG. 3. The opening 240 is configured step-wise. The top portion of the opening 240 is located on the metal layer 220 while a lower part of the opening cuts off poly layer 200 and pad layer 210. The insulation made by the stepped opening efficiently blocks up the routes for charges to flow back to the scribe line regions.

Although specific embodiments have been illustrated and described, it will be obvious to those skilled in the art that various modifications may be made without departing from what is intended to be limited solely by the appended claims.

What is claimed is:

1. A method for minimizing plasma damage, comprising:
   providing a substrate;
   defining a plurality of cell regions and a plurality of scribe line regions on said substrate;
   etching to form a trench region on said scribe line regions, wherein the bottom of said trench region is in contact with said substrate;
   depositing a conducting layer to fill said trench region;
   forming an integrated circuit on said substrate inside said cell regions;
   forming a plurality of channel regions through said scribe line regions, wherein all channel regions connect with said trench region;
   forming a plurality of conductive structures over said scribe line regions, wherein all said conductive structures connect with said channel regions so as to direct excess electrical charge from said scribe line regions to said trench region; and
   insulating said conductive structures and said channel regions to avoid charging shift of said scribe line regions.

2. The method according to claim 1, wherein said substrate comprises silicon.

3. The method according to claim 1, further comprising forming a conducting pad layer on said trench region.

4. The method according to claim 1, wherein said conducting layer comprises polysilicon.

5. The method according to claim 1, wherein said integrated circuit comprises the major compositions of a metal-oxide-semiconductor transistor.

6. The method according to claim 1, wherein said conducting layer inside said trench region provides grounding path to release said excess electrical charge from said scribe line regions.

7. The method according to claim 1, wherein said conductive structures comprise a test key, an alignment key and a CD bar.

8. The method according to claim 7, wherein said conductive structures comprise antenna-like structures so as to extend areas for accepting said excess electrical charge on said scribe line regions.

9. The method according to claim 7, wherein the formation of said conductive structures is conducted on metal layers with generous deposition area.

10. The method according to claim 7, wherein the formation of said conductive structures is conducted on polysilicon layers with generous deposition area.

11. The method according to claim 1, wherein said insulating step comprises pad etching.

12. The method according to claim 1, wherein said excess electrical charge is created by high density plasma etching process during the fabrication of said integrated circuit.

13. A method for forming wafer a trench structure to reduce device damage induced by plasma charge, said method comprising:
   providing a substrate;
   defining a plurality of cell regions and a plurality of scribe line regions on said substrate;
   etching to form a trench region on said scribe line regions, wherein the bottom of said trench region is in contact with said substrate;
   depositing a polysilicon layer to fill said trench region, wherein said trench region comprises a polysilicon pad layer;
   forming an integrated circuit on said substrate inside said cell regions;

forming a plurality of channel regions through said scribe line regions, wherein all channel regions connect with said trench region;

forming a plurality of conductive structures over said scribe line regions, wherein all said conductive structures connect with said channel regions so as to direct excess electrical charge from said scribe line regions to said trench region; and insulating said conductive structures and said channel regions to avoid charging shift of said scribe line regions, wherein said insulating step comprises pad etching.

14. The method according to claim 13, wherein said substrate comprises silicon.

15. The method according to claim 13, wherein said polysilicon layer inside said trench region provides grounding path to release said excess electrical charge from said scribe line regions.

16. The method according to claim 13, wherein said conductive structures comprise a test key, an alignment key and a CD bar.

17. The method according to claim 16, wherein said conductive structures comprise antenna-like structures so as to extend areas for accepting said excess electrical charge on said scribe line regions.

18. The method according to claim 16, wherein the formation of said conductive structures is conducted on metal layers with generous deposition area.

19. The method according to claim 16, wherein the formation of said conductive structures is conducted on polysilicon layers with generous deposition area.

20. The method according to claim 13, wherein said excess electrical charge is created by high density plasma etching process during the fabrication of said integrated circuit.

21. The method according to claim 13, wherein said pad etching process forms a structure with a stepped opening.

22. The method according to claim 21, wherein the width of said stepped opening increases with height.

* * * * *